(12) United States Patent
Viswanathan et al.

(10) Patent No.: US 9,538,659 B2
(45) Date of Patent: Jan. 3, 2017

(54) SOLDER WETTABLE FLANGES AND DEVICES AND SYSTEMS INCORPORATING SOLDER WETTABLE FLANGES

(71) Applicants: Lakshminarayan Viswanathan, Phoenix, AZ (US); Jaynal A. Molla, Gilbert, AZ (US); Mahesh K. Shah, Scottsdale, AZ (US)

(72) Inventors: Lakshminarayan Viswanathan, Phoenix, AZ (US); Jaynal A. Molla, Gilbert, AZ (US); Mahesh K. Shah, Scottsdale, AZ (US)

(73) Assignee: NXP USA, INC., Austin, TX (US)

(*) Notice: Subject to any disclaimer, the term of this patent is extended or adjusted under 35 U.S.C. 154(b) by 301 days.

(21) Appl. No.: 13/972,838

(22) Filed: Aug. 21, 2013

(65) Prior Publication Data
US 2015/0055310 A1    Feb. 26, 2015

(51) Int. Cl.
| | |
|---|---|
| *H01R 9/00* | (2006.01) |
| *H05K 1/18* | (2006.01) |
| *B23K 1/20* | (2006.01) |
| *H05K 1/14* | (2006.01) |
| *H05K 1/05* | (2006.01) |

(52) U.S. Cl.
CPC ............... *H05K 1/181* (2013.01); *B23K 1/20* (2013.01); *H05K 1/141* (2013.01); *H01L 2224/48091* (2013.01); *H01L 2924/19107* (2013.01); *H05K 1/056* (2013.01); *H05K 2201/10015* (2013.01); *H05K 2201/10166* (2013.01); *H05K 2201/10416* (2013.01); *H05K 2201/10553* (2013.01); *H05K 2203/1173* (2013.01); *Y02P 70/611* (2015.11); *Y10T 29/49144* (2015.01); *Y10T 428/12389* (2015.01)

(58) Field of Classification Search
USPC .......................................... 361/774; 428/600
See application file for complete search history.

(56) References Cited

U.S. PATENT DOCUMENTS

| | | | | |
|---|---|---|---|---|
| 2003/0218249 | A1* | 11/2003 | Ho | H01L 21/563 257/737 |
| 2004/0140543 | A1* | 7/2004 | Elpedes | H01L 33/642 257/676 |

* cited by examiner

*Primary Examiner* — Andargie M Aychillhum
(74) *Attorney, Agent, or Firm* — Sherry W. Schumm

(57) ABSTRACT

An embodiment of a solder wettable flange includes a flange body formed from a conductive material. The flange body has a bottom surface, a top surface, sidewalls extending between the top surface and the bottom surface, and one or more depressions extending into the flange body from the bottom surface. Each depression is defined by a depression surface that may or may not be solder wettable. During solder attachment of the flange to a substrate, the depressions may function as reservoirs for excess solder. Embodiments also include devices and systems that include such solder wettable flanges, and methods for forming the solder wettable flanges, devices, and systems.

20 Claims, 7 Drawing Sheets

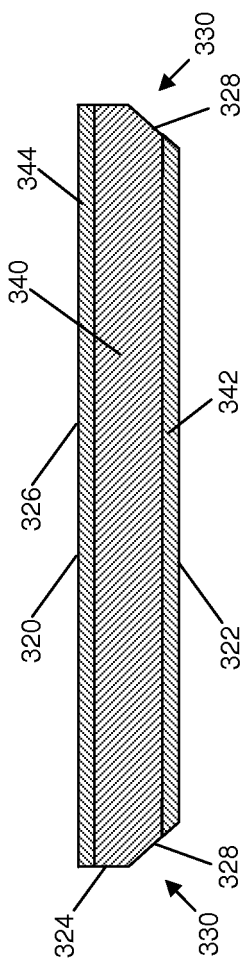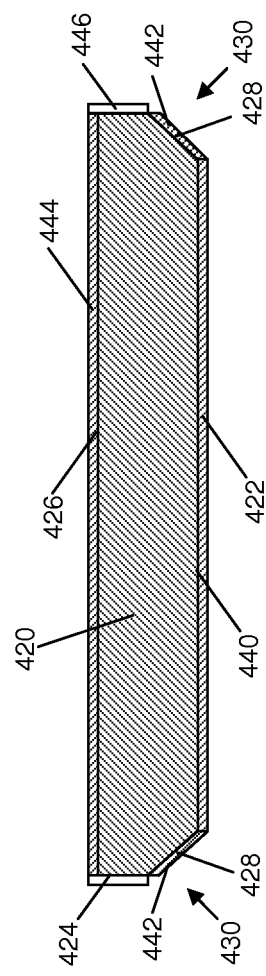

SOLDER WETTABLE FLANGES AND DEVICES AND SYSTEMS INCORPORATING SOLDER WETTABLE FLANGES

TECHNICAL FIELD

Embodiments of the subject matter described herein relate generally to solder wettable flanges for integrated circuits (ICs), and devices and systems that incorporate solder wettable flanges.

BACKGROUND

A surface mount electronic device may include a solder-wettable bottom surface. This enables the device to be physically and, in some cases, electrically coupled to another solder-wettable surface of a substrate (e.g., a pad on a printed circuit board) using solder. Although this type of assembly may have certain advantages over other types of assemblies, interconnection of a major surface of a device to a substrate using solder may raise assembly or manufacturability issues, in some cases.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIGS. 3-8 illustrate cross-sectional, side views of solder wettable flanges, in accordance with various other example embodiments;

DETAILED DESCRIPTION

Figure 1:
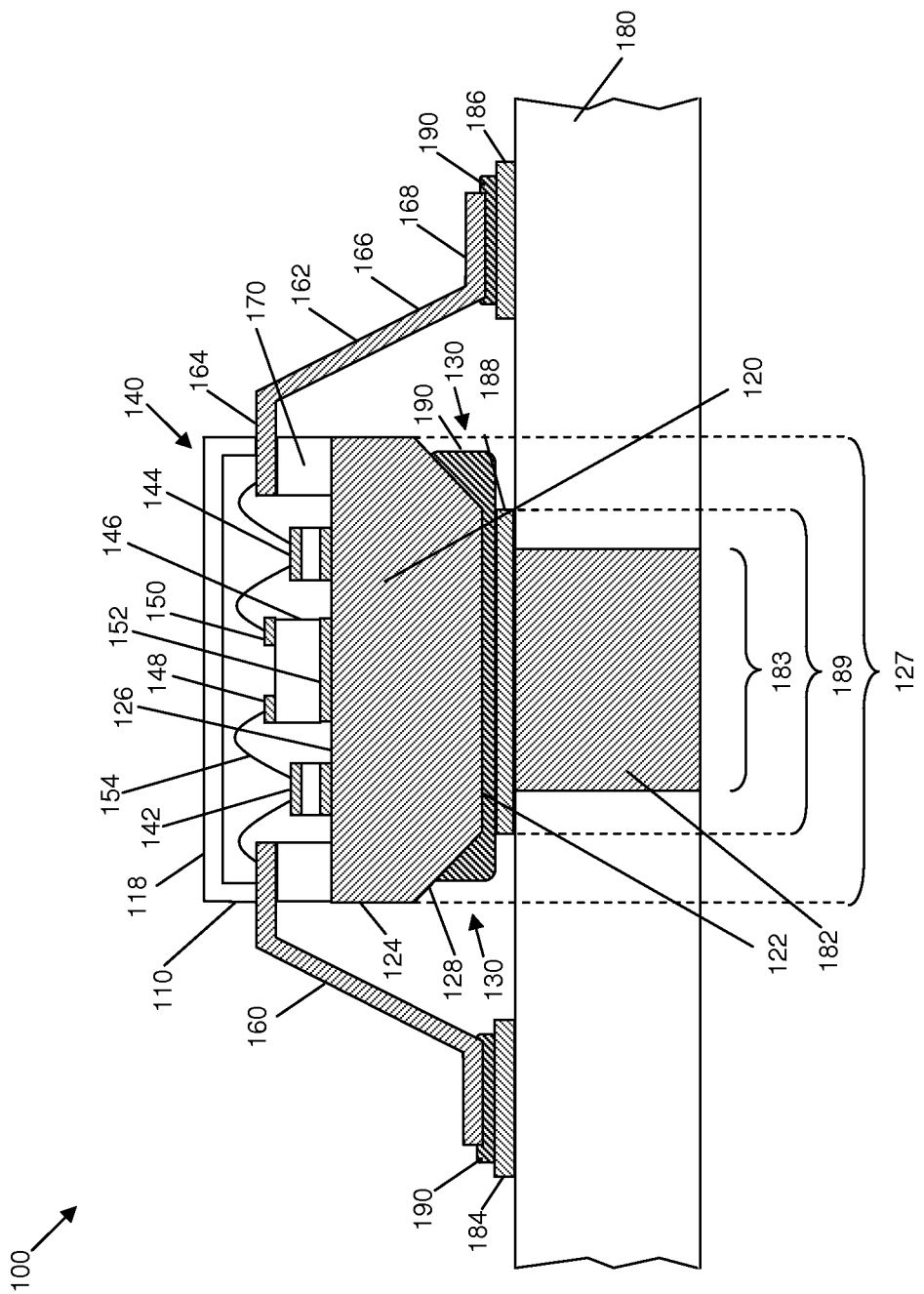
FIG. 1 illustrates a cross-sectional, side view of a portion of an electronic system that includes an electronic device with a solder wettable flange, in accordance with an example embodiment.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Embodiments include solder wettable flanges to which one or more integrated circuits (ICs) and/or other electrical components may be coupled. In addition, embodiments include packaged electronic devices and systems that incorporate such flanges. The terms "solder wettable flange" or "flange," as used herein in conjunction with the descriptions of the various embodiments, mean a rigid structure with at least one solder wettable surface (e.g., at least a solder wettable bottom surface). According to some embodiments, a "solder wettable flange" also may include one or more non-solder wettable surfaces. The term "solder wettable surface," as used herein, means a surface (or a portion thereof) to which melted solder readily may adhere and form a robust bond, once the solder has re-solidified. Conversely, the term "non-solder wettable surface" means a surface to which melted solder may not readily adhere.

According to some embodiments, a solder wettable flange may include one or more conductive surfaces, and/or the bulk of the flange may be formed from one or more conductive materials. As will be described in more detail below, an embodiment of a solder wettable flange includes one or more "depressions" in a solder wettable surface of the flange, and the depression(s) may serve as reservoirs for excess melted solder while the flange is being attached to a substrate. In conventional flanges that lack such depressions or reservoirs, excess melted solder may more easily be extruded from the interface between the flange and the substrate (or more particularly a pad on the substrate) during the device attachment process. Prior to solidifying, the extruded solder may then migrate to locations at which the solder may cause assembly or manufacturability problems (e.g., electrical shorts). For example, in conventional devices, extruded solder may wick up surfaces of the flange and/or travel horizontally across the substrate to form a conductive bridge between two or more device leads or other conductive features.

As used herein, the term "depression" refers to an opening or material-free area that is defined by one or more flange surfaces that are adjacent to but not co-planar with one or more other flange surfaces (e.g., the bottom surface and/or sidewalls of a flange). The term "edge depression" refers to a depression that is located between two non-parallel flange surfaces (e.g., two substantially perpendicular surfaces, such as the bottom surface and a sidewall of a flange). Due to its position, an edge depression may be considered to be a depression in both flange surfaces. Conversely, the term "single surface depression" refers to a depression that is formed in a single, planar flange surface (e.g., a depression in a bottom surface of a flange at a position that is located away from the edge of the bottom surface).

As used herein, the term "depression surface" refers to a surface that at least partially defines a depression. As will be discussed in more detail below, a "depression" in a flange may be defined by one or more depression surfaces, and a "depression" may have any of various geometrical configurations. For example, an "edge depression" may be defined by one or more depression surfaces in the form of a bevel, a chamfer, a concave surface, a convex surface, surfaces joined at an interior corner, a combination of such surfaces, and so on. Conversely, a "single surface depression" may be defined by the surface(s) below an opening or a trench in a single planar surface, and a "single surface depression" may have any of various cross sectional shapes or combinations of shapes (e.g., rectangular, circular, triangular, and so on). Various embodiments of edge depressions and single surface depressions in solder wettable flanges will be described in more detail below in conjunction with the Figures.

FIG. 1 illustrates a cross-sectional, side view of a portion of an electronic system 100 that includes an electronic device 110 with a solder wettable flange 120, in accordance with an example embodiment. The geometry of flange 120 is substantially defined by a solder wettable bottom surface 122, sidewalls 124, a top surface 126, and the surface(s) 128 of one or more depressions 130. In the embodiment illustrated in FIG. 1, sidewalls 124 are substantially perpendicular to and extend between bottom and top surfaces 122, 126, although sidewalls 124 may not be substantially perpendicular to bottom and top surfaces 122, 126, in other embodiments (e.g., sidewalls 124 may lie in planes that are not strictly perpendicular to the bottom and/or top surfaces 122, 126).

In the embodiment depicted in FIG. 1, depressions 130 may be classified as edge depressions, in that each depression 130 is located between non-parallel surfaces (i.e., between the bottom surface 122 and a sidewall 124). More particularly, depressions 130 are configured as chamfers in the embodiment of FIG. 1, where the term "chamfer," as used herein, refers to a substantially planar bevel connecting two non-parallel surfaces of a flange (e.g., bottom surface 122 and a sidewall 124 of flange 120). The term "bevel," as used herein, refers to a substantially planar surface of a flange that is not perpendicular to the two surfaces of the flange between which the bevel extends.

As mentioned above, the bottom surface 122 of flange 120 is solder wettable. According to an embodiment, the depression surfaces 128 also are solder wettable. In contrast, in an embodiment, the sidewalls 124 are non solder wettable. Accordingly, solder (e.g., solder 190), when melted, may readily adhere to the depression surfaces 128, but may not readily adhere to the sidewalls 124. In alternate embodiments, depression surfaces 128 or portions thereof may be non solder wettable. In addition, in some embodiments, sidewalls 124 may be solder wettable. As will be described in more detail later, the surfaces of flange 120 that are solder wettable may be made so by plating the surfaces with a material that is characteristically wettable and/or resists oxidation (e.g., silver (Ag), palladium (Pd), gold (Au), another noble metal, copper (Cu), nickel (Ni), tin (Sn), lead tin (PbSn), combinations of such materials, and other suitable materials). Alternatively, the portions of the flange 120 that correspond to the solder wettable surfaces may be formed of a material that is characteristically wettable and resists oxidation without the use of a plating material. In contrast, the surfaces of flange 120 that are non solder wettable may be surfaces that have been oxidized, or surfaces to which a non solder wettable coating has been applied. Alternatively, the portions of the flange 120 that correspond to the non solder wettable surfaces may be formed of a material that is characteristically non wettable, regardless of whether or not the surface has oxidized.

In addition to solder wettable flange 120, device 110 includes a circuit 140 comprised of a plurality of electrical components coupled to or over a top surface 122 of flange 120. More particularly, the circuit 140 may be electrically coupled between an input lead 160 and an output lead 162 of the device 110. The circuit 140 may include components of any of various types of circuits, including a power amplifier, a processor, a sensor device, and so on. For example, the circuit 140 may include one or more vertical field effect transistors (FETs) 146, one or more capacitors 142 on an input side of the FET(s) 146, one or more capacitors 144 on an output side of the FET(s) 146, and a plurality of inductive elements, some of which may be formed from bondwires (e.g., bondwire 154) extending between the input lead 160, the capacitors 142, 144, the FET(s) 146, the output lead 162, and other electrical components (not shown) of the device 110. According to a particular embodiment, the FET(s) 146 may form portions of a power amplifier stage, and the capacitors 142, 144 and inductive elements may form portions of input and output impedance matching circuits.

When device 110 is incorporated into the electronic system 100, flange 120 may serve as a conduit to a reference voltage (e.g., ground) of the electronic system 100. In such an embodiment, some of the electrical components may include conductive contacts that correspond to terminals of the various electrical components. For example, each of capacitors 142, 144 may include top and bottom conductive contacts, where each top conductive contact corresponds to a first terminal of the capacitor, and each bottom conductive contact corresponds to a second terminal of the capacitor. In the configuration illustrated in FIG. 1, for example, since each capacitor 142, 144 includes a bottom conductive contact coupled to flange 120, each capacitor 142 may represent a shunt capacitor to ground.

Similarly, FET 146 may include conductive gate and source contacts 148, 150 on a top surface of the FET 146, and a conductive drain contact 152 on a bottom surface of the FET 146. Accordingly, when an appropriate voltage signal is applied to the gate contact 148, current may flow between the source and drain contacts 150, 152. Since the drain contact 152 is coupled to flange 120, the drain of the FET 146 accordingly may be coupled to the reference voltage (e.g., ground) through the flange 120.

According to a further embodiment, the input and output leads 160, 162 are electrically insulated from the flange 120 by an insulating structure 170. For example, the insulating structure 170 may have a window frame type of configuration, which includes sides proximate to the edges of the top surface 126 of the flange 120, and a central opening through which the top surface 126 is exposed (e.g., for attachment of the components of circuit 140). Insulating structure 170 may be formed from ceramic, printed circuit board materials, and/or other dielectric materials, in various embodiments.

In addition to the above-described elements, device 110 may further include a lid 118, which establishes an air cavity within which the circuit 140 is disposed. The lid 118 may be formed from ceramic, plastic, or some other material, in various embodiments.

Although a specific type of circuit 140 has been described in conjunction with FIG. 1, it should be understood that a wide variety of different types of circuits may be included in device 110. In addition, although leads 160, 162 are described above as input and output leads, leads may serve other functions, as well (e.g., supplying power, ground, control signals, or other functions).

According to an embodiment, leads 160, 162 have a "gull wing" configuration, in that each lead includes a substantially horizontal upper portion 164, a substantially vertical or diagonal middle portion 166, and a substantially horizontal lower portion 168 (or "foot"), where the upper and lower portions 164, 168 are connected by the middle portion 166. The upper portion 164 is supported by the insulating structure 170 and is directly connected with the circuit 140 (e.g., through bondwires). The foot 168 may be substantially co-planar with the bottom surface 122 of the flange 120, and is vertically displaced from the bottom surface 122 of the flange 120. Due to the relative positioning of the foot 168 and the bottom surface 122 of the flange 120, the gull wing configuration of leads 160, 162 facilitates surface mounting of device 110 on a substantially planar substrate, such as substrate 180. In alternate embodiments, the device leads may be flat leads, or the leads may have some other configuration.

According to an embodiment, substrate 180 may be formed from standard PCB materials, although substrate 180 may be formed from other materials, as well. To provide for electrical and mechanical coupling of device 110 to substrate 180, substrate 180 includes solder wettable lead pads 184, 186 (or "lands"), and a solder wettable flange pad 188 on its top surface. The lands 184, 186 and flange pad 188 are located in positions that correspond to the relative orientations and locations of the feet 168 of the leads 160, 162 and the flange 120, respectively. The footprint of the flange pad 188 (partially indicated by width 189) may roughly correspond to the footprint of the bottom surface 122 of the flange 120, in an embodiment, and as shown in FIG. 1. In an alternate embodiment, the footprint 188 of the flange pad 188 may be larger than the footprint of the bottom surface 122 (e.g., the width 189 and depth, not shown, of flange pad 188 may approach or exceed the width 127 and depth, not shown, of the flange 120).

In the embodiment illustrated in FIG. 1, substrate 180 also includes a conductive coin 182 that extends between the top and bottom surfaces of substrate 180, and that is positioned under the flange pad 188. The conductive coin 182 may be configured to facilitate electrical coupling of the flange 120 to a voltage reference (e.g., ground), and may also function as a conduit for removing heat generated by device 110 during operation of the system 100. According to an embodiment, the width 183 of coin 182 is less than the width 189 of flange pad 188. In alternate embodiments, coin 182 and flange pad 188 may be substantially the same, or the width of coin 182 may be greater than the width of flange pad 188. In addition, coin 182 may have any number of different configurations, only one of which is illustrated in FIG. 1. In still other alternate embodiments, coin 182 may be replaced with conductive vias or excluded from the system 100 altogether. Alternatively, a system may include a combination of a coin (e.g., coin 182) and conductive vias.

Device 110 is electrically and mechanically coupled to the substrate 180 with solder 190. More particularly, during the device attachment process, solder paste, solder performs, or a combination of both are deposited on lands 184, 186 and flange pad 188, the leads 160, 162 and flange 120 are aligned with their respective pads 184, 186, 188, and the assembly is subjected to a reflow process. During the reflow process, the solder paste and/or preform melts, adheres to the wettable pads 184, 186, 188, leads 160, 162, and flange bottom surface 122, and subsequently cools and solidifies, thus establishing electrical and mechanical bonds between the device 110 and the pads 184, 186, 188.

When the solder 190 transitions to the liquid state during the reflow process, the distance between the flange bottom surface 122 and the flange pad 188 may decrease slightly, causing excess solder 190 to be pushed toward the sidewalls 124 of the flange 120. According to an embodiment, the excess solder 190 may collect in depressions 130, which function as reservoirs for the excess solder 190. In an embodiment in which the depression surfaces 128 (or a portion thereof) are solder wettable and the sidewalls 124 are non solder wettable, the solder may readily adhere to the depression surfaces 128, while being restricted from wetting up the sidewalls 124. As mentioned previously, in an alternate embodiment, depression surfaces 128 may be non solder wettable, in an alternate embodiment. In either embodiment, the inclusion of depressions 130 as a reservoir for excess solder 190 decreases the likelihood that excess solder 190 may be extruded from the interface between the flange 120 and the flange pad 188 and migrate to other portions of the device 110 or system 100 at which the extruded solder may cause reliability issues (e.g., electrical shorts).

Figure 2:
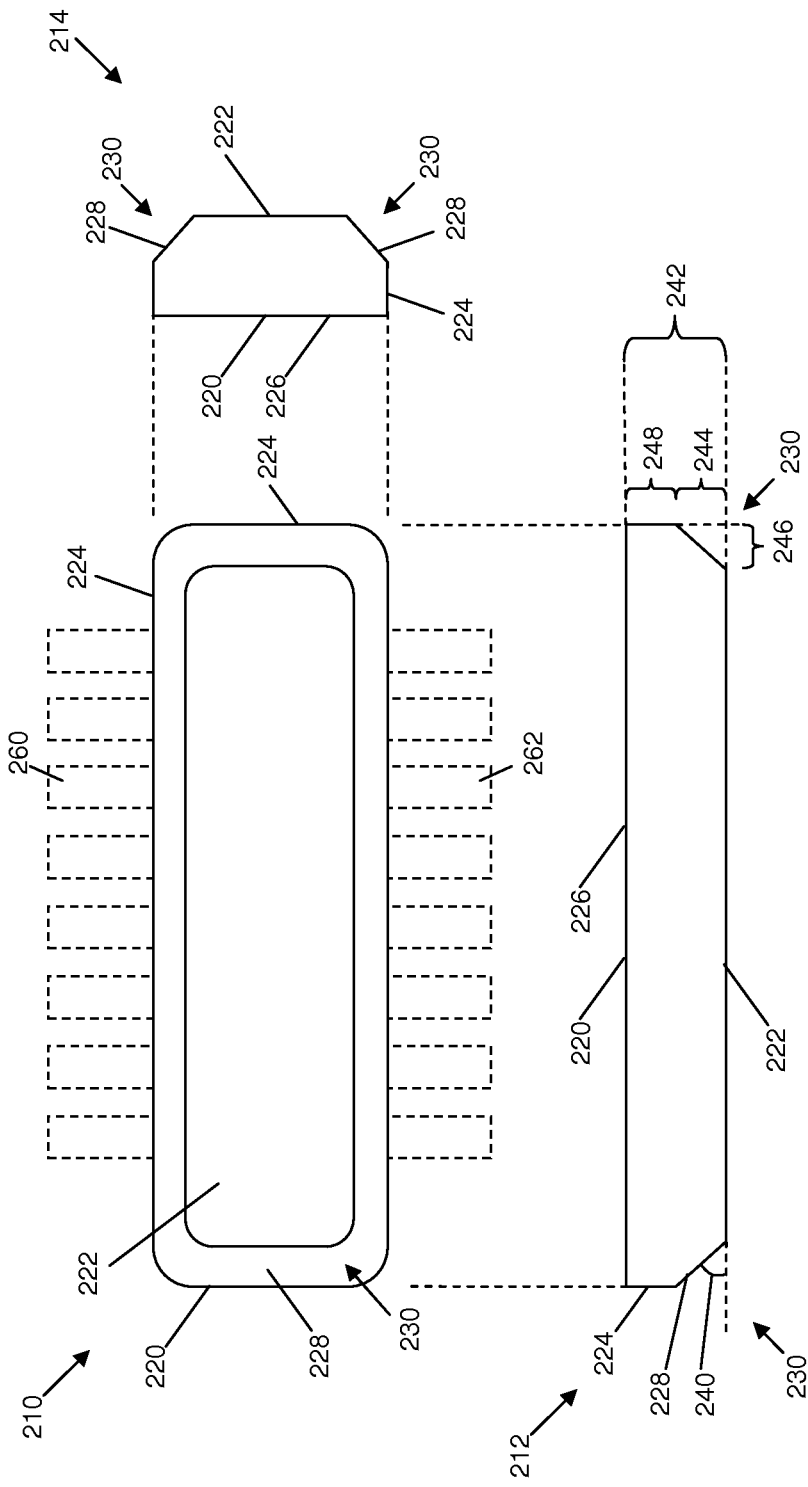
FIG. 2 illustrates exterior bottom and side views of a solder wettable flange, in accordance with an embodiment.

FIG. 2 illustrates an exterior bottom view 210 and side views 212, 214 of a solder wettable flange 220 (e.g., solder wettable flange 120, FIG. 1), in accordance with an embodiment. FIG. 2 also indicates, with dashed lines, some potential positions of leads 260, 262, although the leads 260, 262 are not considered to be portions of the flange 220 (i.e., the leads 260, 262 are part of a device that also includes the flange 220, such as device 100, and accordingly the leads 260, 262 would be electrically and physically separated from the flange 220 by an isolation structure, such as isolation structure 170). In the illustrated example, eight leads 260, 262 are shown to extend in directions that are perpendicular to two sides of the flange 220. In alternate embodiments, more or fewer leads may be included within a device, the leads may have different geometries from each other or from those illustrated, and/or the leads may extend from four sides of the flange, rather than from only two sides.

Similar to the flange 120 described in conjunction with FIG. 1, the geometry of flange 220 is substantially defined by a solder wettable bottom surface 222, sidewalls 224, a top surface 226, and the surfaces 228 of depressions 230, each of which is configured as a chamfer. In the embodiment of FIG. 2, the depressions 230 include four edge depressions proximate each of the four sides of the flange 220, and perpendicular edge depressions 230 merge at the corners of the flange 220.

Each depression 230 is defined by a depression surface 228, which is in a plane that is not parallel with the plane of the bottom surface 222 of the flange 220. More specifically, the angular offset between the depression surface 228 and the bottom surface 222 is indicated by angle 240. According to an embodiment, angle 240 is in a range of about 30 degrees to about 60 degrees, although angle 240 may be larger or smaller, as well.

Each depression 230 also may be defined by a height 244 and a width 246, where the height 244, as depicted in side view 212, indicates the depth of depression 230 above the bottom surface 222 of the flange 220 (e.g., the height 244 is a dimension taken perpendicular to the bottom surface 222), and the width 246 indicates the size of the opening in the bottom surface 222 that defines the depression 230 (e.g., the width 246 is a dimension taken parallel to the bottom surface 222). According to an embodiment, the height 244 of each depression 230 is in a range of about 10 percent to 100 percent of the height 242 of the flange 240. In another embodiment, the height 244 may be in a range of about 15 percent to about 85 percent of the height 242 of the flange 240. In still another embodiment, the height 244 may be in a range of about 40 percent to about 60 percent of the height 242 of the flange 240. The height 244 may be larger or smaller than the above-given ranges, as well. For example, in the embodiment of FIG. 2, angle 240 is about 45 degrees, and the height 244 and width 246 of depression 230 are about 50 percent of the height 242 of the flange 220. Accordingly, the height 244 and width 246 of depression 230 each are approximately equal to the height 248 of sidewall 224. In other embodiments, the height 244 and/or width 246 of depression 230 relative to the height 242, 248 of the flange 220 and/or sidewall 224 may be different, as indicated by the ranges given above.

Referring again to FIG. 1, the cross-sectional view of flange 120 indicates that the flange 120 may be formed from a single, homogenous conductive material, in an embodiment. For example, flange 120 may be formed from copper (Cu), a copper alloy, or other bulk conductive materials. Alternatively, in some embodiments, flange 120 may be formed from an integrated combination of multiple materials, such as a bulk conductive material that is integrated with one or more other materials. For example, one or more bulk conductive materials such as copper, a copper alloy, silver (Ag), aluminum (Al), and/or other bulk materials in molten or other structural forms may be integrated with tungsten (W), molybdenum (Mo), diamond, graphite, silicon carbide (SiC), or other materials in skeletal, particle (e.g., microscopic or macroscopic particles, fibers, flakes, or other discrete forms), or other structural forms. As a non-limiting example, a copper tungsten flange may be formed from an integrated combination of tungsten in a skeletal form with molten copper infiltrated throughout the tungsten structure. As other non-limiting examples, a copper diamond flange may be formed from an integrated combination of copper and diamond particles, a copper SiC flange may be formed from an integrated combination of copper and SiC fibers, a copper graphite flange may be formed from an integrated combination of copper and graphite flakes, and so on. In various alternate embodiments, a flange may be formed from a composite of multiple layers of conductive materials.

For example, FIG. 3 is a cross-sectional, side view of a solder wettable flange 320, in accordance with another example embodiment. As with flanges 120, 220 from FIGS. 1 and 2, the geometry of flange 320 is substantially defined by a solder wettable bottom surface 322, sidewalls 324, a top surface 326, and the surfaces 328 of depressions 330, each of which is configured as a chamfer. In contrast with the flanges 120, 220 from FIGS. 1 and 2, however, flange 320 is illustrated as a composite of multiple layers 340, 342, 344 of different conductive materials. For example, the bulk (or majority) of the flange 320 may be formed from a relatively thick first layer 340 of a first conductive material, and relatively thin second and third layers 342, 344 of one or more second conductive materials may be disposed on the bottom and top surfaces, respectively, of the first layer 340. For example, the first layer 340 may be formed from molybdenum (Mo), CuMo, or another suitable conductive material, and the second and third layers 342, 344 may be formed from Cu, a Cu alloy, silver, aluminum, or another suitable conductive material, any of which may be integrally combined with one or more other materials (e.g., tungsten, molybdenum, diamond, graphite, silicon carbide, or other structures or particles).

In the embodiment illustrated in FIG. 3, the composite flange 320 is formed from three conductive layers 320, 322, 324. In other embodiments, a flange may be formed from two conductive layers, from more than three conductive layers, or from a combination of conductive and non-conductive materials. In addition, it should be noted that, although each of FIGS. 1 and 4-8 depict flanges comprised of a single, bulk conductive material, any of the flanges 420, 520, 620, 720, 820 may be composite flanges (e.g., similar to the flange 320 of FIG. 3).

As mentioned previously, one or more surfaces of a flange may be treated or coated to render the surfaces solder wettable or non-solder wettable. For example, FIG. 4 is a cross-sectional, side view of a solder wettable flange 420, in accordance with another example embodiment. As with flanges 120, 220, 320 from FIGS. 1-3, the geometry of flange 420 is substantially defined by a bottom surface 422, sidewalls 424, a top surface 426, and the surfaces 428 of depressions 430, each of which is configured as a chamfer. In addition, flange 420 includes solder wettable material 440, 442, 444 on its bottom surface 422, depression surfaces 428, and top surface 426, respectively. According to an embodiment, the solder wettable material 440, 442, 444 includes a plating material that is characteristically solder wettable and resists oxidation. For example, the solder wettable material 440, 442, 444 may include silver, palladium, gold, another noble metal, copper, nickel, tin, lead tin, combinations of such materials, and/or other suitable materials, or another suitable material. In the embodiment illustrated in FIG. 4, the depression surfaces 428 are entirely plated (or rendered solder wettable). In an alternate embodiment, only a portion of the depression surfaces 428 may be plated (or rendered solder wettable). For example, referring again to FIG. 3, a composite flange 320 may include a first layer 340 formed from CuMo (or some other material) and a bottom layer 342 formed from copper (or some other material), and only the copper portion of the depression surface 328 may be plated, while the CuMo portion of the depression surface 328 is not plated (e.g., after the plating process, the plating on the CuMo portion of the depression surface 328 may be removed, such as by chemical cleaning).

In contrast, the sidewalls 424 may be rendered non solder wettable, in an embodiment. For example, as illustrated in FIG. 4, a layer 446 of non solder wettable material may be deposited on the sidewalls 424. For example, layer 446 may include a material that readily oxidizes, such as nickel, or another material that is non solder wettable. Alternatively, rather than specifically depositing a layer 446 of non solder wettable material on the sidewalls 424, the sidewalls 424 may be subjected to a treatment that renders them substantially non solder wettable. For example, the sidewalls 424 may be permitted to oxidize over a period of time, or a specific oxidation process may be performed to encourage oxidation of the sidewalls. When oxidized, the sidewalls 424 may be substantially non solder wettable. As also mentioned previously, in an alternate embodiment, the depression surfaces 428 also may be non solder wettable (e.g., oxidized and/or coated with a layer of non solder wettable material).

As indicated previously, a depression in a flange that is suitable to function as a reservoir for excess solder during a device attachment process may have a configuration other than a chamfer, and/or may be positioned away from an edge of the flange bottom surface. For example, FIGS. 5-8 illustrate various cross-sectional, side views of solder wettable flanges 520, 620, 720, 820, in accordance with various other example embodiments.

Figure 5:
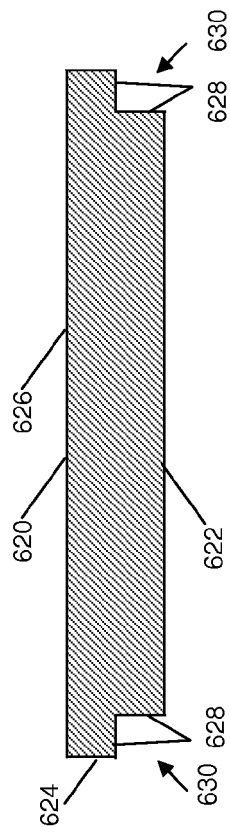
Figure 6:
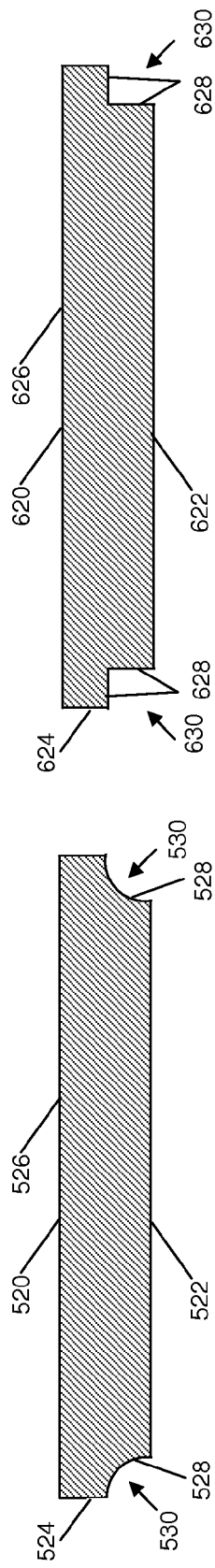

More specifically, FIG. 5 is a cross-sectional, side view of a flange 520 having a geometry that is substantially defined by a solder wettable bottom surface 522, sidewalls 524, a top surface 526, and depression surfaces 528 that are concave. Accordingly, the cross-sectional shape of the depressions 530 are essentially arcs (e.g., circular arcs, elliptical arcs, parabolic arcs, and so on). In contrast, FIG. 6 is a cross-sectional, side view of a flange 620 having a geometry that is substantially defined by a solder wettable bottom surface 622, sidewalls 624, a top surface 626, and depression surfaces 628 that define an interior corner. Accordingly, the cross-sectional shape of the depressions 630 are essentially intersecting, perpendicular lines. In an alternate embodiment, the depression surfaces 628 may not be substantially perpendicular to each other.

Figure 7:
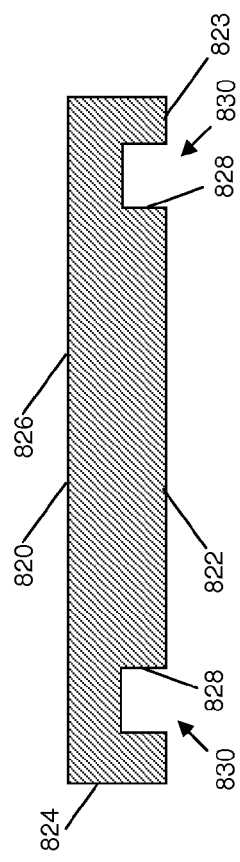

In each of the previously discussed embodiments, the depressions 130, 230, 330, 430, 530, 630 (FIGS. 1-6) each are edge depressions. In various alternate embodiments, a flange may include one or more single surface depressions (i.e., depressions that are defined by depression surface(s) below an opening or a trench in a single planar surface, such as the bottom surface of a flange). For example, FIG. 7 is a cross-sectional, side view of a flange 720 having a geometry that is substantially defined by a solder wettable bottom surface 722, sidewalls 724, a top surface 726, and depression surfaces 728 that define single surface depressions 730. In the embodiment of FIG. 7, the cross-sectional shape of the single surface depressions 730 are essentially arcs (e.g., circular arcs, elliptical arcs, parabolic arcs, and so on), and the single surface depressions 730 are located below openings in the bottom surface 722 of the flange 720. As FIG. 7 shows, a portion 723 of the flange bottom surface 722 is present between each single surface depression 730 and an edge of the bottom surface 722. In various embodiments, the portion 723 of the bottom surface 722 between each depression 730 and its nearest edge may be solder wettable or non solder wettable.

Figure 8:
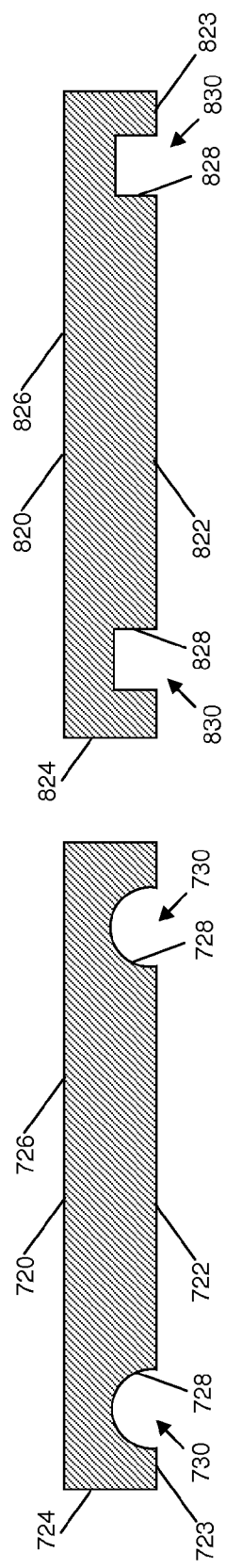

FIG. 8 is a cross-sectional, side view of another flange 820 having a geometry that is substantially defined by a solder wettable bottom surface 822, sidewalls 824, a top surface 826, and depression surfaces 828 that define single surface depressions 830. In contrast with the embodiment of FIG. 7, however, the cross-sectional shape of the single surface depressions 830 are essentially rectangular. In various embodiments, the portion 823 of the bottom surface 822 between each depression 830 and its nearest edge may be solder wettable or non solder wettable. In still other alternate embodiments, the cross-sectional shape of single surface depression may have a different geometry (e.g., triangular, and so on).

Figure 9:
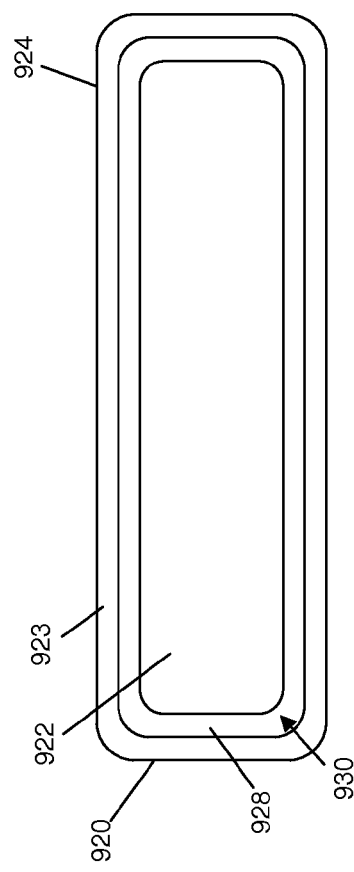
FIGS. 9-12 illustrate exterior bottom views of solder wettable flanges, in accordance with various other example embodiments.

To further illustrate various alternate embodiments, FIGS. 9-12 illustrate exterior bottom views of solder wettable flanges 920, 1020, 1120, 1220, in accordance with various other example embodiments. For example, FIG. 9 illustrates a bottom view of a solder wettable flange 920, which includes a single surface depression 930 in its bottom surface 922. The single surface depression 930 is defined by depression surface 928. As illustrated in FIG. 9, the single surface depression 930 is located away from the edges of the bottom surface 922 (i.e., the intersections between the bottom surface 922 and sidewalls 924), and extends entirely around the bottom surface 922 to form a continuous depression 930 that is inset from the perimeter of the bottom surface 922. A portion 923 of the bottom surface 922 located between the single surface depression 930 and the sidewalls 924 may be solder wettable or non solder wettable.

Figure 10:
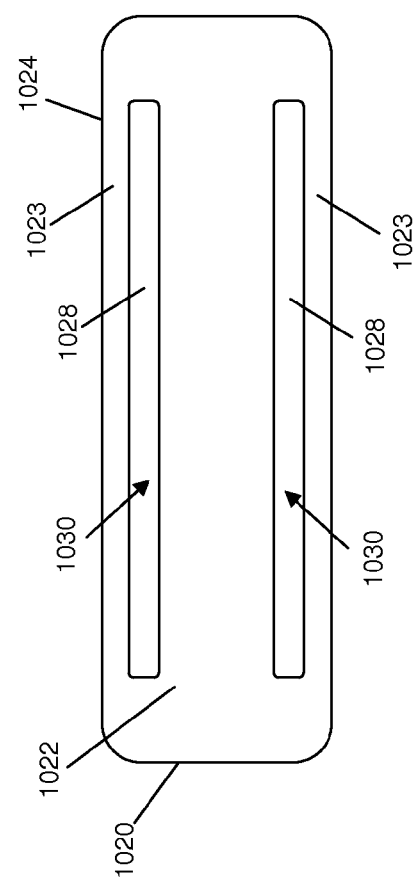

FIG. 10 illustrates a bottom view of a solder wettable flange 1020, which includes two single surface depressions 1030 in its bottom surface 1022. The single surface depressions 1030 are defined by depression surfaces 1028. As illustrated in FIG. 10, the single surface depressions 1030 are located away from two edges of the bottom surface 1022 (i.e., the intersections between the bottom surface 1022 and sidewalls 1024). However, in contrast to the embodiment of FIG. 9, the single surface depressions 1030 are not joined, and thus do not form a continuous depression around the perimeter of the bottom surface 1022. As with previously-described embodiments, portions 1023 of the bottom surface 1022 located between the single surface depressions 1030 and the sidewalls 1024 may be solder wettable or non solder wettable, in various embodiments. In addition, other portions of the bottom surface may be non solder wettable, according to an embodiment (e.g., portions adjacent the left and right edges of the bottom surface 1022). In such an embodiment, the additional non solder wettable portions may function to channel excess solder toward the depressions 1030 during a device attachment process, rather than being extruded out sides at which the depressions 1030 are not present.

Figure 11:
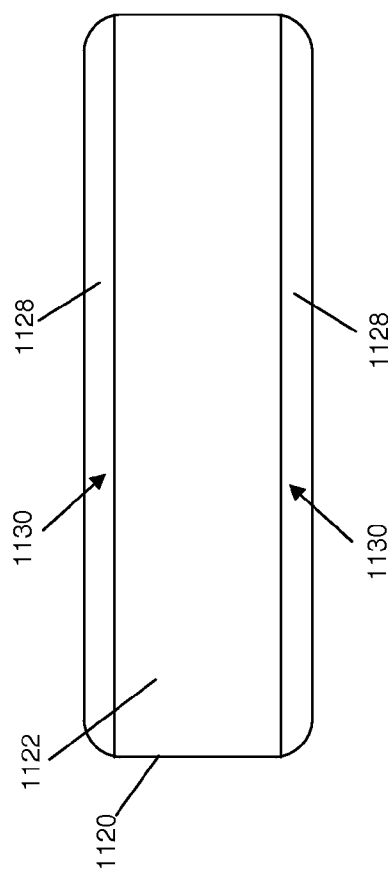

FIG. 11 illustrates a bottom view of a solder wettable flange 1120, which includes two edge depressions 1130 in its bottom surface 1122, where the edge depressions 1130 are defined by depression surfaces 1128. The solder wettable flange 1120 of FIG. 11 is similar to the solder wettable flange 220 illustrated in FIG. 2, except that the flange 1120 of FIG. 11 does not include edge depressions at all edges of the bottom surface 1122. Instead, flange 1120 includes edge depressions 1130 at only two edges of the bottom surface 1122. According to an embodiment, portions of the bottom surface may be non solder wettable (e.g., portions adjacent the left and right edges of the bottom surface 1122). In such an embodiment, the non solder wettable portions may function to channel excess solder toward the depressions 1130 during a device attachment process, rather than being extruded out sides at which the depressions 1130 are not present.

Figure 12:
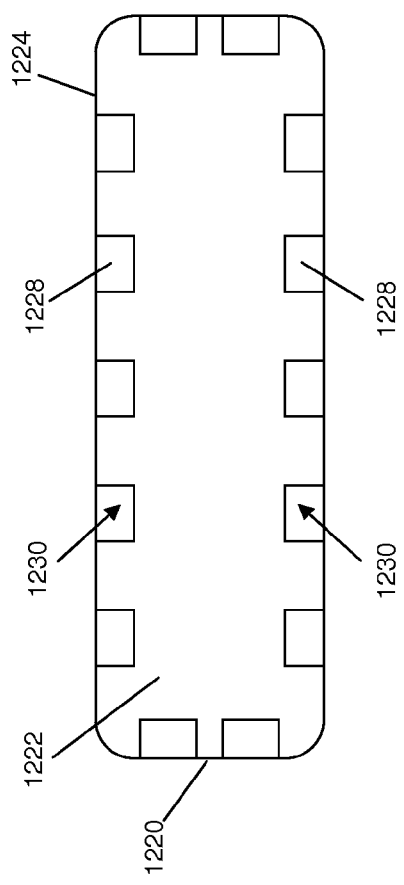

Finally, FIG. 12 illustrates a bottom view of a solder wettable flange 1220, which includes a plurality of edge depressions 1230 along each edge of its bottom surface 1222, where the edge depressions 1230 are defined by depression surfaces 1228. The embodiment of FIG. 12 is included to illustrate that an edge depression need not extend along an entire edge of a bottom surface. According to an embodiment, portions of the bottom surface may located between each adjacent edge depression 1230 may be non solder wettable. In such an embodiment, the non solder wettable portions may function to channel excess solder toward the depressions 1230 during a device attachment process, rather than being extruded out between the depressions 1230.

Figure 13:
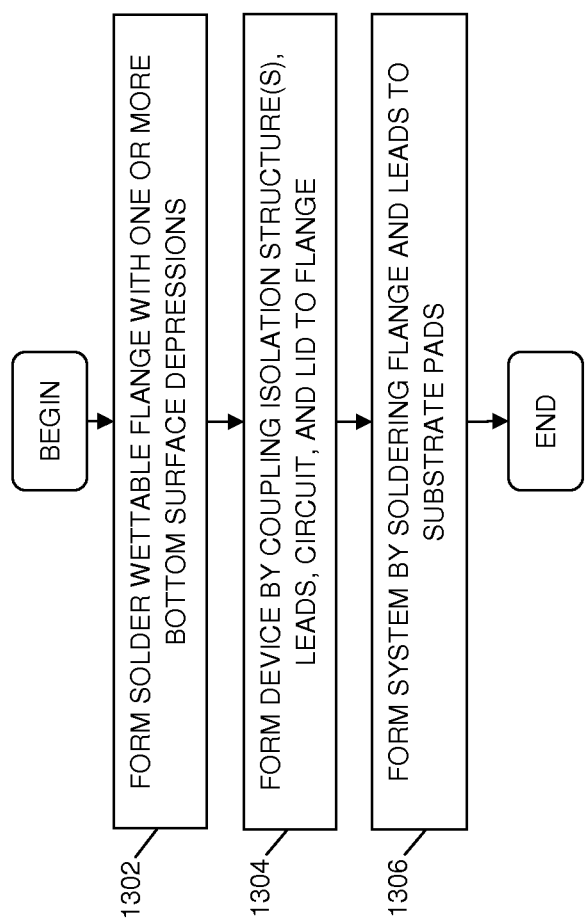
FIG. 13 is a flowchart of a method for making a solder wettable flange, an electronic device that includes the solder wettable flange, and a system that includes the electronic device, in accordance with an example embodiment.

FIG. 13 is a flowchart of a method for fabricating a solder wettable flange (e.g., any of the flange embodiments illustrated in FIGS. 1-12), fabricating an electronic device (e.g., device 110, FIG. 1) that includes the solder wettable flange, and fabricating a system (e.g., system 100, FIG. 1) that includes the electronic device, in accordance with an example embodiment. The method may begin, in block 1302, by forming a solder wettable flange that includes one or more depressions in its bottom surface. According to an embodiment, the solder wettable flange may be formed singly, or it may be formed as one of multiple flanges that are attached to a frame structure and later singulated. As discussed previously, a solder wettable flange may be formed as a single bulk conductive material, or as a composite of multiple material layers (e.g., including only conductive layers or a combination of conductive and non-conductive layers), in various embodiments. In addition, the depressions in the bottom surface may be formed as edge depressions, single surface depressions, or any combination thereof. In various embodiments, the depressions may be formed by a technique selected from machining, sawing, stamping, etching, drilling, or another material removal methods. Alternatively, the solder wettable flange may be formed (e.g., cast) with the edge depressions. Formation of the solder wettable flange also may include one or more steps to render one or more surfaces solder wettable (e.g., one or more plating steps), and/or one or more steps to render one or more surfaces non solder wettable (e.g., oxidation and/or material deposition steps).

In block 1304, an electronic device (e.g., electronic device 110, FIG. 1) that includes the solder wettable flange is formed by coupling various elements to the solder wettable flange. For example, formation of the device may include coupling one or more isolation structures (e.g., isolation frame 170, FIG. 1) to the top surface of the flange, and coupling leads (e.g., leads 160, 162, FIG. 1) to the isolation structure(s). In addition, formation of the device may include physically coupling some or all of the components of an electronic circuit (e.g., circuit 140, FIG. 1) to the top surface of the flange, and electrically coupling those components to each other and to the leads (e.g., using bondwires 154, FIG. 1). Formation of the device may be completed by capping the device (e.g., with cap 118, FIG. 1) or encapsulating the electronic components (e.g., using a plastic encapsulant).

In block 1306, a system (e.g., system 100, FIG. 1) that includes the electronic device is formed by soldering the flange and leads to solder wettable pads (e.g., pads 184, 186, 188, FIG. 1) of a substrate (e.g., substrate 180, FIG. 1). The device attachment process may include depositing a conductive solder paste on the pads (and/or on the bottom surface of the flange and the lead feet), aligning the flange and the leads on their corresponding pads, and performing a solder reflow process to melt the solder (e.g., solder 190, FIG. 1). As discussed previously, according to various embodiments, excess solder may collect within the depressions in the bottom surface of the flange, rather than being extruded from the interface between the flange and the flange pad to potentially migrate to an area at which a reliability issue may arise.

Embodiments of a solder wettable flange include a flange body formed from a conductive material and having a bottom surface, a top surface, sidewalls extending between the top surface and the bottom surface, and one or more depressions extending into the body from the bottom surface, wherein each depression is defined by a depression surface.

According to a further embodiment, the bottom surface is solder wettable, the depression surface is solder wettable, and the sidewalls are non solder wettable. According to another further embodiment, the bottom surface is solder wettable, and the depression surface is non solder wettable. According to another further embodiment, at least one of the one or more depressions is an edge depression that extends between the bottom surface and a sidewall. According to another further embodiment, the edge depression is defined by one or more depression surfaces selected from a bevel, a chamfer, a concave surface, a convex surface, surfaces joined at an interior corner, and a combination of such surfaces. According to another further embodiment, at least one of the one or more depressions is a single surface depression that is located on the bottom surface, and a portion of the bottom surface is present between the single surface depression and an edge of the bottom surface. According to another further embodiment, the single surface depression is selected from an opening in the bottom surface and a trench in the bottom surface. According to another further embodiment, heights of the one or more depressions are in a range of 10 percent to 100 percent of a height of the solder wettable flange. According to another further embodiment, the flange body is formed from a single conductive material or a plurality of conductive material layers, including materials selected from copper, a copper alloy, silver, aluminum, molybdenum, and copper molybdenum.

According to another further embodiment, the flange body is formed from a conductive material that is integrally combined with one or more other materials, wherein the conductive material is selected from copper, a copper alloy, silver, and aluminum, and the one or more other materials are selected from tungsten, molybdenum, diamond, graphite, and silicon carbide. According to another further embodiment, at least a portion of the flange body is plated with a plating material selected from silver, palladium, gold, copper, nickel, tin, lead tin, and a combination of said plating materials.

An embodiment of an electronic device includes an electronic circuit, a plurality of leads electrically coupled to the electronic circuit, and a solder wettable flange coupled to the electronic circuit and the plurality of leads. The solder wettable flange is formed from a conductive material and has a bottom surface, a top surface, sidewalls extending between the top surface and the bottom surface, and one or more depressions extending into the body from the bottom surface, wherein each depression is defined by a depression surface.

According to a further embodiment, the circuit comprises components of a power amplifier. According to another further embodiment, the circuit comprises at least one component that has a conductive contact coupled to the top surface of the solder wettable flange. According to another further embodiment, the plurality of leads is selected from gull wing leads and straight leads. According to another further embodiment, the one or more depressions are selected from one or more edge depressions, one or more single surface depressions, and combinations of edge depressions and single surface depressions. According to another further embodiment, at least one of the one or more depressions is a chamfer that extends between the bottom surface and a sidewall.

An embodiment of a method includes forming a solder wettable flange from a conductive material and having a bottom surface, a top surface, and sidewalls extending between the top surface and the bottom surface, and forming one or more depressions extending into the bottom surface. Each depression is defined by a depression surface, and the one or more depressions may be formed by a technique selected from machining, sawing, stamping, etching, and drilling.

According to a further embodiment, the method also includes rendering the depression surface solder wettable, and rendering the sidewalls non solder wettable. According to another further embodiment, the method also includes forming an electronic device by coupling one or more isolation structures to the top surface of the flange, coupling leads to the one or more isolation structures, physically coupling some or all components of an electronic circuit to the top surface of the flange, and electrically coupling the components to each other and to the leads. According to another further embodiment, the method also includes forming an electronic system by soldering the bottom surface of the solder wettable flange and the plurality of leads to solder wettable pads of a substrate.

For the sake of brevity, conventional semiconductor fabrication techniques may not be described in detail herein. In addition, certain terminology may also be used herein for the purpose of reference only, and thus are not intended to be limiting, and the terms "first", "second" and other such numerical terms referring to structures do not imply a sequence or order unless clearly indicated by the context.

The foregoing description refers to elements or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A solder wettable flange comprising:
a flange body formed from a conductive material and having a bottom surface, a top surface, sidewalls extending between the top surface and the bottom surface, and one or more depressions extending into the body from the bottom surface, wherein each depression is defined by a depression surface, the bottom surface is solder wettable, and the sidewalls are non-solder wettable due to a feature selected from oxidation of the sidewalls, and the sidewalls being at least partially formed from a non-solder wettable material.

2. The solder wettable flange of claim 1, wherein at least a portion of the depression surface is solder wettable.

3. The solder wettable flange of claim 1, wherein at least one of the one or more depressions is an edge depression that extends between the bottom surface and a sidewall.

4. The solder wettable flange of claim 3, wherein the edge depression is defined by one or more depression surfaces selected from a bevel, a chamfer, a concave surface, a convex surface, surfaces joined at an interior corner, and a combination of such surfaces.

5. The solder wettable flange of claim 3, wherein the edge depression is a chamfer that extends between the bottom surface and the sidewall.

6. The solder wettable flange of claim 1, wherein heights of the one or more depressions are in a range of 10 percent to 100 percent of a height of the solder wettable flange.

7. The solder wettable flange of claim 1, wherein the flange body is formed from a single conductive material or a plurality of conductive material layers, including materials selected from copper, a copper alloy, silver, aluminum, molybdenum, and copper molybdenum.

8. The solder wettable flange of claim 1, wherein the flange body is formed from a conductive material that is integrally combined with one or more other materials, wherein the conductive material is selected from copper, a copper alloy, silver, and aluminum, and the one or more other materials are selected from tungsten, molybdenum, diamond, graphite, and silicon carbide.

9. The solder wettable flange of claim 1, wherein at least a portion of the flange body is plated with a plating material selected from silver, palladium, gold, copper, nickel, tin, lead tin, and a combination of said plating materials.

10. The solder wettable flange of claim 1, wherein the flange body is a composite of a layer of copper defining the bottom surface, and a layer selected from molybdenum and copper molybdenum defining at least a portion of the sidewalls.

11. A solder wettable flange comprising:
a flange body formed from a conductive material and having a bottom surface, a top surface, sidewalls extending between the top surface and the bottom surface, and one or more depressions extending into the body from the bottom surface, wherein each depression is defined by a depression surface, wherein the bottom surface is solder wettable, and the depression surface is non solder wettable due to a feature selected from oxidation, and the depression surface being partially formed from a non-solder wettable material.

12. The solder wettable flange of claim 11, wherein the flange body is a composite of a layer of copper defining the bottom surface, and a layer selected from molybdenum and copper molybdenum defining at least a portion of the depression surface.

13. A solder wettable flange comprising:
a flange body formed from a conductive material and having a bottom surface, a top surface, sidewalls extending between the top surface and the bottom surface, and one or more depressions extending into the body from the bottom surface, wherein each depression is defined by a depression surface, wherein at least one of the one or more depressions is a single surface depression that is located on the bottom surface, wherein a portion of the bottom surface is present between the single surface depression and an edge of the bottom surface.

14. The solder wettable flange of claim 13, wherein the single surface depression is selected from an opening in the bottom surface and a trench in the bottom surface.

15. An electronic device comprising:
an electronic circuit;
a plurality of leads electrically coupled to the electronic circuit, wherein each of the plurality of leads includes an upper portion that is connected to the electronic circuit, and a lower portion; and
a solder wettable flange coupled to the electronic circuit and the plurality of leads, wherein the solder wettable flange is formed from a conductive material and has a bottom surface that is substantially co-planar with the lower portion of each of the plurality of leads, a top surface, sidewalls extending between the top surface and the bottom surface, and one or more depressions extending into the body from the bottom surface, wherein each depression is defined by a depression surface, the bottom surface is solder wettable, and the sidewalls are non-solder wettable due to a feature selected from oxidation of the sidewalls, and the sidewalls being at least partially formed from a non-solder wettable material.

16. The electronic device of claim 15, wherein the circuit comprises components of a power amplifier.

17. The electronic device of claim 15, wherein the circuit comprises at least one component that has a conductive contact coupled to the top surface of the solder wettable flange.

18. The electronic device of claim 15, wherein the plurality of leads are gull wing leads.

19. The electronic device of claim 15, wherein the one or more depressions are selected from one or more edge depressions, one or more single surface depressions, and combinations of edge depressions and single surface depressions.

20. The electronic device of claim 15, wherein at least one of the one or more depressions is a chamfer that extends between the bottom surface and a sidewall.

* * * * *